United States Patent
Ono et al.

(10) Patent No.: US 12,117,887 B2
(45) Date of Patent: Oct. 15, 2024

(54) SLAVE DEVICE AND HOST DEVICE

(71) Applicant: Panasonic Intellectual Property Management Co., Ltd., Osaka (JP)

(72) Inventors: Tadashi Ono, Osaka (JP); Yoshihisa Inagaki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 70 days.

(21) Appl. No.: 18/122,977

(22) Filed: Mar. 17, 2023

(65) Prior Publication Data
US 2023/0221791 A1 Jul. 13, 2023

Related U.S. Application Data

(63) Continuation of application No. PCT/JP2021/032673, filed on Sep. 6, 2021.

(30) Foreign Application Priority Data

Sep. 25, 2020 (JP) .................. 2020-160517

(51) Int. Cl.
  G06F 1/32 (2019.01)
  G06F 1/04 (2006.01)
  G06F 1/3296 (2019.01)
(52) U.S. Cl.
  CPC .............. *G06F 1/3296* (2013.01); *G06F 1/04* (2013.01)

(58) Field of Classification Search
None
See application file for complete search history.

(56) References Cited

U.S. PATENT DOCUMENTS

2010/0325457 A1* 12/2010 Lachwani ............. G06F 1/3237
  713/323
2018/0365188 A1* 12/2018 Srivastava .......... G06F 13/4045

FOREIGN PATENT DOCUMENTS

JP  2015-232772  12/2015

OTHER PUBLICATIONS

SD Card Association, "SD Specifications Part 1 Physical Layer Simplified Specification Version 4.10", Jan. 22, 2013, 202 pages.
SD Card Association, "SD Specifications Part 1 Physical Layer Specification Simplified Specification Version 7.10", Mar. 25, 2020, 296 pages.

* cited by examiner

*Primary Examiner* — Keshab R Pandey
(74) *Attorney, Agent, or Firm* — Wenderoth, Lind & Ponack, L.L.P.

(57) ABSTRACT

When a host-slave system including a host device and a slave device transitions to a power-down mode, the host device drives a CMD line in order of a high level, a low level, and a high level, and stops supplying a clock signal after a predetermined time elapses. During a power-down mode period, the slave device stops supplying a power to a back-end module. When the host device resumes the supply of the clock signal, the host-slave system returns from the power-down mode.

17 Claims, 12 Drawing Sheets

FIG. 5

SLAVE DEVICE AND HOST DEVICE

TECHNICAL FIELD

The present disclosure relates to a slave device including a flash memory or the like as a back-end module, and a host device for controlling the slave device.

BACKGROUND ART

In recent years, slave devices such as an SD card and a memory stick, which include, as a back-end module, a large-capacity nonvolatile storage element such as a flash memory and can perform high-speed data access (Read and Write) processing, have become widespread in the market. Such a slave device is connected to a host device such as a personal computer, a smartphone, a digital camera, an audio player, and a car navigation system by a predetermined interface (hereinafter, abbreviated as I/F), and is used as an external recording medium.

In addition, there is also a slave device in which a wireless communication module capable of wirelessly communicating with an outside is mounted as the back-end module, and the wireless communication function can be added to the host device by being connected to the host device.

In a state where the host device is powered on, the slave device receives power supply from the host device, and distributes the power to components including the back-end module to enable data access.

In the slave device of the related art, the power is constantly supplied to the back-end module when the host device is powered on. Accordingly, even in a case where there is no data access from the host device via the I/F, the power is supplied to the back-end module, and power is wasted. For example, the power is depleted in a short time in the host device driven by a power supply having a small power supply capacity such as a small battery, and it is difficult for the host device and the slave device to continuously operate for a long period.

In order to solve the above problem, PTL 1 discloses a suspend mode and NPL 1 discloses a power-down mode as techniques for suppressing power consumption in a case where data access is not performed.

Hereinafter, the power-down mode described in NPL 1 will be described as an exemplary embodiment of the related art with reference to FIGS. 1 to 5.

FIG. 1 is a block diagram for describing a host-slave system including a slave device having the power-down mode of the related art described in NPL 1 and a host device that controls the slave device. As illustrated in FIG. 1, host device 100 includes at least power supply unit 101 and host device controller 102. Host device controller 102 includes at least host device I/F 103, CPU 104, and RAM 105 that is a volatile storage element.

Host device 100 and slave device 120 are mechanically connected. In addition, host device 100 is electrically connected to slave device 120 via VDD line 110 that is a 3.3 V power supply line.

Slave device 120 includes at least slave device controller 121, back-end module 122, SW 123 that switches ON and OFF of power supply to back-end module 122, and back-end bus 124 that performs data communication between slave device controller 121 and back-end module 122. Back-end module 122 refers to a recording medium such as a flash memory or a device such as a wireless communication module, but will be described as a recording medium here.

Slave device controller 121 includes at least slave device I/F 125, register 126, CPU 127, and RAM 128 that is a volatile storage element.

A 3.3 V power supplied to slave device 120 via VDD line 110 is supplied to slave device controller 121, and is also supplied to back-end module 122 only in a case where SW 123 is ON.

Host device I/F 103 and slave device I/F 125 are connected via CLK line 111, CMD line 112, and DAT line 113, and perform bidirectional signal communication by a single-ended method. Note that, DAT line 113 includes four signal lines, and can transmit and receive a 4-bit signal in one sampling period of a clock signal.

FIG. 2 is a diagram for describing a format of a command transmitted by host device 100 to instruct slave device 120.

Command 200 includes at least command index 201 and argument 202. Command index 201 is a numerical value representing a content of an operation instructed by host device 100 to slave device 120. In the present exemplary embodiment of the related art, transition and return to the power-down mode are realized by using a general-purpose Write command and a general-purpose Read command for accessing register 126 in slave device controller 121.

A configuration of argument 202 changes in accordance with command index 201. When command index 201 indicates the general-purpose Write command or the general-purpose Read command, argument 202 includes at least register address 203 and access size 204.

FIG. 3 is a diagram for describing a register map in register 126. In the drawing, a vertical axis indicates the register address, and a horizontal axis indicates a bit position of each register variable included in a register space indicated by a predetermined register address. In FIG. 3, only the register variable related to the power-down mode is described, and R/W-type register variable PDMN 302 capable of performing Read and Write and RO-type register variable PDMR 303 capable of performing only Read in a Y-th bit are defined in an X-th bit of the register space indicated by register address PD_ADDR 301.

FIG. 4 is a timing chart when the host-slave system including the slave device having the power-down mode of the related art and the connected host device transitions from a normal mode to the power-down mode, and FIG. 5 is a timing chart when the host-slave system returns from the power-down mode to the normal mode. Note that, in FIG. 4 and subsequent drawings, power down may be abbreviated as PD.

First, a case where the host-slave system transitions from the normal mode to the power-down mode will be described with reference to FIGS. 1 to 4.

In the normal mode, host device 100 supplies the 3.3 V power to slave device 120 via VDD line 110, and supplies a single-ended clock signal of a predetermined frequency via CLK line 111. A high-level voltage of the clock signal is any voltage, but is defined as 3.3 V or 1.8 V in NPL 1. Note that, a low level is 0 V. In the normal mode, slave device 120 turns on SW 123 and supplies the 3.3 V power to back-end module 122.

Host device 100 pulls up all the signal lines of CMD line 112 and DAT line 113 to the same voltage as the high level of the single-ended clock signal supplied via CLK line 111 with a pull-up resistor (not illustrated) in order to prevent each signal line from being in a floating state in a state where slave device 120 is not mounted.

In addition, when the host device and the slave device do not perform signal communication with each other, host device 100 and slave device 120 do not drive terminals of CMD line 112 and DAT line 113 to the low level or the high level, and enter an input state, that is, a high impedance (Hi-Z) state. Accordingly, when signal transmission is not performed from either host device 100 or the slave device, these signal lines are at the high level.

When host device 100 desires to transition the host-slave system to the power-down mode, host device I/F 103 transmits general-purpose Write command 401a to slave device I/F 125 via CMD line 112 in response to an instruction from CPU 104 driven based on a software program loaded onto RAM 105 in host device controller 102. Host device 100 can transmit any command according to a command format illustrated in FIG. 2 depending on programming of software loaded on RAM 105.

In general, CMD line 112 is driven by host device 100 during a period in which host device I/F 103 transmits a command to slave device I/F 125 and predetermined periods before and after the period.

General-purpose Write command 401a sets a numerical value for identifying that the command is the general-purpose Write command to command index 201. PD_ADDR 301 that is a register address including PDMN 302 is set to register address 203, and a value of 1 or more is set to access size 204.

When slave device I/F 125 receives general-purpose Write command 401a via CMD line 112, slave device I/F 125 transmits, to host device I/F 103 via CMD line 112, response 401b indicating that general-purpose Write command 401a is correctly received. In general, during a period during which slave device I/F 125 transmits the response to host device I/F 103 and predetermined periods before and after the period, CMD line 112 is driven by slave device 120.

Further, slave device I/F 125 causes CPU 127 to generate an interruption of the reception of general-purpose Write command 401a. This interruption is notified to CPU 127, and CPU 127 starts processing when general-purpose Write command 401a mounted in a software program loaded onto RAM 128 is received.

When host device I/F 103 receives response 401b, host device I/F 103 transmits data 401c to slave device I/F 125 via DAT line 113. In general, during a period during which host device I/F 103 transmits the data to slave device I/F 125 and predetermined periods before and after the period, DAT line 113 including four signal lines is driven by host device 100.

Slave device I/F 125 writes, to register 126, a content of data 401c from register address PD_ADDR 301 of register 126 designated by register address 203 of general-purpose Write command 401a by a size (byte) designated by access size 204. Here, a value on data 401c is set such that "1" is written to PDMN 302. When "1" is written to PDMN 302, the host-slave system transitions from the normal mode to a power-down transition mode. A minimum period of 1142 clock cycle (cyc) is required from the start of the transmission of general-purpose Write command 401a by host device I/F 103 to the completion of the transmission of data 401c.

When "1" is written to PDMN 302, register 126 causes CPU 127 to generate an interruption of a power-down mode transition instruction. At this time, CPU 127 starts power-down preprocessing that is processing necessary for transitioning to a power-down mode in which a power is not supplied to back-end module 122.

As an example of the power-down preprocessing, there is processing in which CPU 127 writes the data on RAM 128 to back-end module 122 via back-end bus 124 in order to cause a latest file management table currently retained in RAM 128 and a file management table recorded in back-end module 122 to coincide with each other. When this power-down preprocessing is not performed and when the supply of the 3.3 V power to slave device 120 is stopped due to an event such as removal of slave device 120 from host device 100 during the power-down mode, the latest file management table retained on RAM 128 disappears. As a result, when slave device 120 is activated next time, a discrepancy occurs between the file management table recorded in back-end module 122 and actual file data, and the file data recorded in back-end module 122 cannot be correctly read out, and a problem is caused.

Host device 100 can confirm whether or not slave device 120 is in the power-down mode by detecting PDMR 303 of register 126. Thus, host device I/F 103 transmits general-purpose Read command 402a to slave device 120 via CMD line 112.

General-purpose Read command 402a sets a numerical value for identifying that the command is the general-purpose Read command to command index 201. PD_ADDR 301 that is a register address including PDMR 303 is set to register address 203, and a value of 1 or more is set to access size 204.

When slave device I/F 125 receives general-purpose Read command 402a via CMD line 112, slave device I/F 125 transmits, to host device I/F 103 via CMD line 112, response 402b indicating that general-purpose Read command 402a is correctly received.

After transmission of response 402b, slave device I/F 125 sets, to data 402c, a value of register 126 corresponding to the size (byte) designated by access size 204 from register address PD_ADDR 301 of register 126 designated by register address 203 of general-purpose Read command 402a. At this time, slave device 120 is executing the power-down preprocessing, and a value of the register PDMR 303 is "0". Accordingly, "0" is set to a value of a bit corresponding to PDMR 303 in data 402c.

Slave device I/F 125 transmits data 402c to host device I/F 103 via DAT line 113. In general, during a period during which slave device I/F 125 transmits the data to host device I/F 103 and predetermined periods before and after the period, DAT line 113 including four signal lines is driven by slave device 120.

Since the value of PDMR 303 is "0", host device I/F 103 that receives data 402c detects that the mode is the power-down transition mode, and continues transmitting the clock signal via CLK line 111.

When the power-down preprocessing is completed in slave device 120, register 126 changes the value of PDMR 303 from "0" to "1".

Thereafter, host device I/F 103 transmits general-purpose Read command 403a to slave device 120 via CMD line 112, and slave device I/F 125 transmits response 403b. A content of general-purpose Read command 403a is similar to a content of general-purpose Read command 402a.

When slave device I/F 125 receives general-purpose Read command 403a, the power-down preprocessing is completed, and the value of PDMR 303 is "1". Accordingly, slave device I/F 125 sets a value of a bit corresponding to PDMR 303 in data 403c transmitted by slave device I/F 125 in response to the reception of general-purpose Read command 403a to "1", and then transmits data 403c. CPU 127 switches SW 123 from ON to OFF, and stops the power supply to back-end module 122. Note that, a switching operation of SW 123 may be performed by another component element in slave device controller 121 other than CPU 127.

Since the value of PDMR 303 is "1", host device I/F 103 that receives data 403c detects that the mode transmits from the power-down transition mode to the power-down mode. Thereafter, host device I/F 103 stops supplying the clock signal via CLK line 111 (404). Note that, host device I/F 103 may not stop supplying the clock signal in the power-down mode.

Next, a case where the host-slave system returns from the power-down mode to the normal mode will be described with reference to FIGS. 1 to 3 and 5.

When host device 100 desires to return the host-slave system from the power-down mode to the normal mode and when the clock signal is stopped, the transmission of the clock signal via CLK line 111 is resumed (500). Thereafter, host device I/F 103 transmits general-purpose Write command 501a to slave device 120 via CMD line 112 in response to an instruction of CPU 104 driven based on the software program loaded onto RAM 105 in host device controller 102.

General-purpose Write command 501a is similar to general-purpose Write command 401a.

When slave device I/F 125 receives general-purpose Write command 501a via CMD line 112, slave device I/F 125 transmits, to host device I/F 103 via CMD line 112, response 501b indicating that general-purpose Write command 501a is correctly received. Further, slave device I/F 125 causes CPU 127 to generate an interruption of the reception of general-purpose Write command 401a. As a result, CPU 127 starts processing when general-purpose Write command 501a is received.

When host device I/F 103 receives response 501b, host device I/F 103 transmits data 501c to slave device I/F 125 via DAT line 113. Here, a value of the data 501c is set such that "0" is written to PDMN 302. When "1" is written to PDMN 302, the host-slave system transitions from the power-down mode to a power-down return mode.

Similar to FIG. 4, a minimum period of 1142 cyc is required from the start of the transmission of general-purpose Write command 501a by host device I/F 103 to the completion of the transmission of data 501c.

When "0" is written to PDMN 302, register 126 causes CPU 127 to generate an interruption of a power-down mode return instruction. At this time, CPU 127 switches SW 123 from OFF to ON. As a result, the 3.3 V power is supplied to back-end module 122 again. At the same time, CPU 127 starts power-down postprocessing that is processing necessary for returning from the power-down mode to the normal mode. As an example of the power-down postprocessing, there is initial setting processing by slave device controller 121 accompanying the resuming of the power supply to back-end module 122.

Host device 100 can confirm whether or not slave device 120 returns to the normal mode by detecting PDMR 303 of register 126. Thus, host device I/F 103 transmits general-purpose Read command 502a to slave device 120 via CMD line 112. General-purpose Read command 502a is similar to general-purpose Read command 402a.

When slave device I/F 125 receives general-purpose Read command 502a via CMD line 112, slave device I/F 125 transmits, to host device I/F 103 via CMD line 112, response 502b indicating that general-purpose Read command 502a is correctly received.

When slave device I/F 125 receives general-purpose Read command 502a, since the power-down postprocessing is being executed and the value of PDMR 303 is "1", "1" is set to a value of a bit corresponding to PDMR 303 in data 502c transmitted by slave device I/F 125 in response to the reception of general-purpose Read command 502a. Slave device I/F 125 transmits data 502c to host device I/F 103 via DAT line 113.

Since the value of PDMR 303 is "1", host device I/F 103 that receives data 502c detects that the mode is the power-down return mode and is not the normal mode.

When the power-down postprocessing is completed in slave device 120, register 126 changes the value of PDMR 303 from "1" to "0".

Thereafter, host device I/F 103 transmits general-purpose Read command 503a to slave device 120 via CMD line 112, and slave device I/F 125 transmits response 503b. A content of general-purpose Read command 503a is similar to a content of general-purpose Read command 502a.

When slave device I/F 125 receives general-purpose Read command 503a, the power-down postprocessing is completed, and the value of PDMR 303 is "0". Accordingly, slave device I/F 125 sets a value of a bit corresponding to PDMR 303 in data 503c transmitted by slave device I/F 125 in response to the reception of general-purpose Read command 503a to "1", and then transmits data 503c.

Since the value of PDMR 303 is "0", host device I/F 103 that receives data 503c detects that the mode transitions from the power-down return mode to the normal mode. As a result, host device 100 can issue normal command 504a accompanied by reading and writing data from and to back-end module 122 to slave device 120. After normal command 504a is received, slave device I/F 125 transmits corresponding response 504b to host device I/F 103.

In the host-slave system according to the exemplary embodiment of the related art described above, there are the following problems when the transition from the normal mode to the power-down mode and the return from the power-down mode to the normal mode are executed.

When the host device instructs slave device 120 to transition to the power-down mode or return from the power-down mode, this is executed by writing a predetermined value in the register variable PDMN by a general-purpose Write command (401a in FIGS. 4 and 501a in FIG. 5). In order to cause the general-purpose Write command to be applied to various kinds of control including control requiring a time for processing inside the slave device in addition to the transition and return to the power-down mode described in the exemplary embodiment of the related art, a maximum time from the transmission of the general-purpose Write command to the completion of the corresponding processing is uniformly defined as 1 sec. As a result, since the host device can determine that the processing inside the slave device is completed when the host device waits for a maximum of 1 sec regardless of the kind of control by the general-purpose Write command, there is an advantage that waiting time processing in the host device is simplified.

On the other hand, in a method using the general-purpose Write command described in the exemplary embodiment of the related, power accompanying the supply of the 3.3 V power to the back-end module for the period of the maximum of 1 sec is wastefully consumed in each of the power-down transition mode in the middle of transitioning from the normal mode to the power-down mode and the power-down return mode in the middle of returning from the power-down mode to the normal mode. At this time, in a host device driven by a power supply having a small power supply capacity such as a small battery, the power supply can be depleted in a short time, and thus, it is extremely inconvenient.

In addition, the maximum time required for returning from the power-down mode to the normal mode is 1 sec.

Even though the host device attempts to resume data access to the back-end module during a power-down mode period, since it is necessary to wait for at least 1 sec until the host device actually returns to the normal mode and accesses the back-end module and a buffer for retaining data for 1 sec period is required in the host device, an increase in cost of the host device is caused.

CITATION LIST

Patent Literature

PTL 1: Unexamined Japanese Patent Publication No. 2015-232772

Non-Patent Literature

NPL 1: SD Card Association, "SD Specifications Part 1 Physical Layer Simplified Specification Version 4.10", Jan. 22, 2013, p. 142-147

SUMMARY OF THE INVENTION

The present disclosure provides a slave device and a host device that realize reduction in time from a normal mode to a power-down mode.

A slave device according to an example of the present disclosure relates to a slave device connected to a host device via a plurality of signal lines. The slave device includes a controller and a back-end module. Further, the following operation is performed in a first mode in which a clock signal supplied from the host device is received via a first signal line and a power supplied from the host device is supplied to both the controller and the back-end module. When the controller receives a first predetermined signal pattern via a second signal line and does not receive the clock signal via the first signal line, the operation is to transition to a second mode in which the power supplied to the back-end module is stopped. In the second mode, when the controller receives the clock signal via the first signal line, the slave device transitions to the first mode and transmits a second predetermined signal pattern via the second signal line.

A host device in an example of the present disclosure is connected to a slave device via a plurality of signal lines.

The host device includes a controller and a power supply unit that supplies a power to the slave device. Further, in order to transmit and receive data to and from the slave device, the power is supplied from the power supply unit to the slave device via a power supply line, and a clock signal is supplied from the controller via a first signal line. When the host device no longer needs to transmit and receive a signal to and from the slave device, after the controller transmits a first predetermined signal pattern via a second signal line, and the supply of the clock signal via the first signal line is stopped. When the host device needs to transmit and receive the signal to and from the slave device, the clock signal is supplied from the controller via the first signal line. After the controller receives a second predetermined signal pattern via the second signal line, the host device transmits and receives the signal to and from the slave device.

According to the present disclosure, the time required for transition to the power-down mode can be shortened.

BRIEF DESCRIPTION OF THE DRAWINGS

Figure 5:
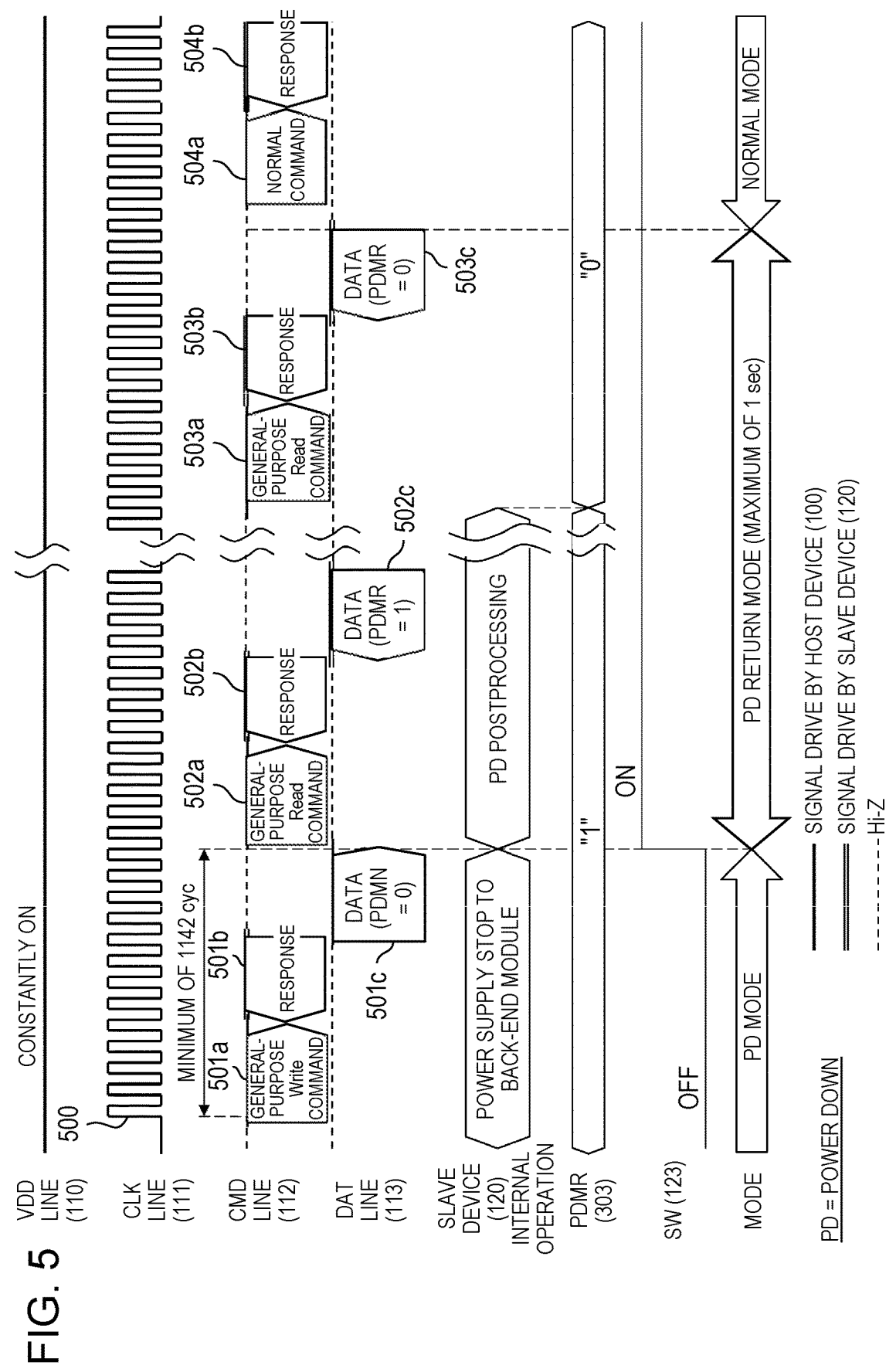

FIG. 5 is a timing chart when the host-slave system returns from the power-down mode to the normal mode in the exemplary embodiment of the related art.

DESCRIPTION OF EMBODIMENT

Hereinafter, exemplary embodiments will be described in detail with appropriate reference to the drawings. However, unnecessarily detailed description may not be described. For example, the detailed description of already well-known matters and the overlap description of substantially the same configurations may not be described. This is to avoid an unnecessarily redundant description below and to facilitate understanding of a person skilled in the art.

Note that, the inventor of the present disclosure provides the accompanying drawings and the following description in order to allow those skilled in the art to fully understand the present disclosure, and does not intend to limit the subject matter as described in the appended claims.

First Exemplary Embodiment

Figure 6:
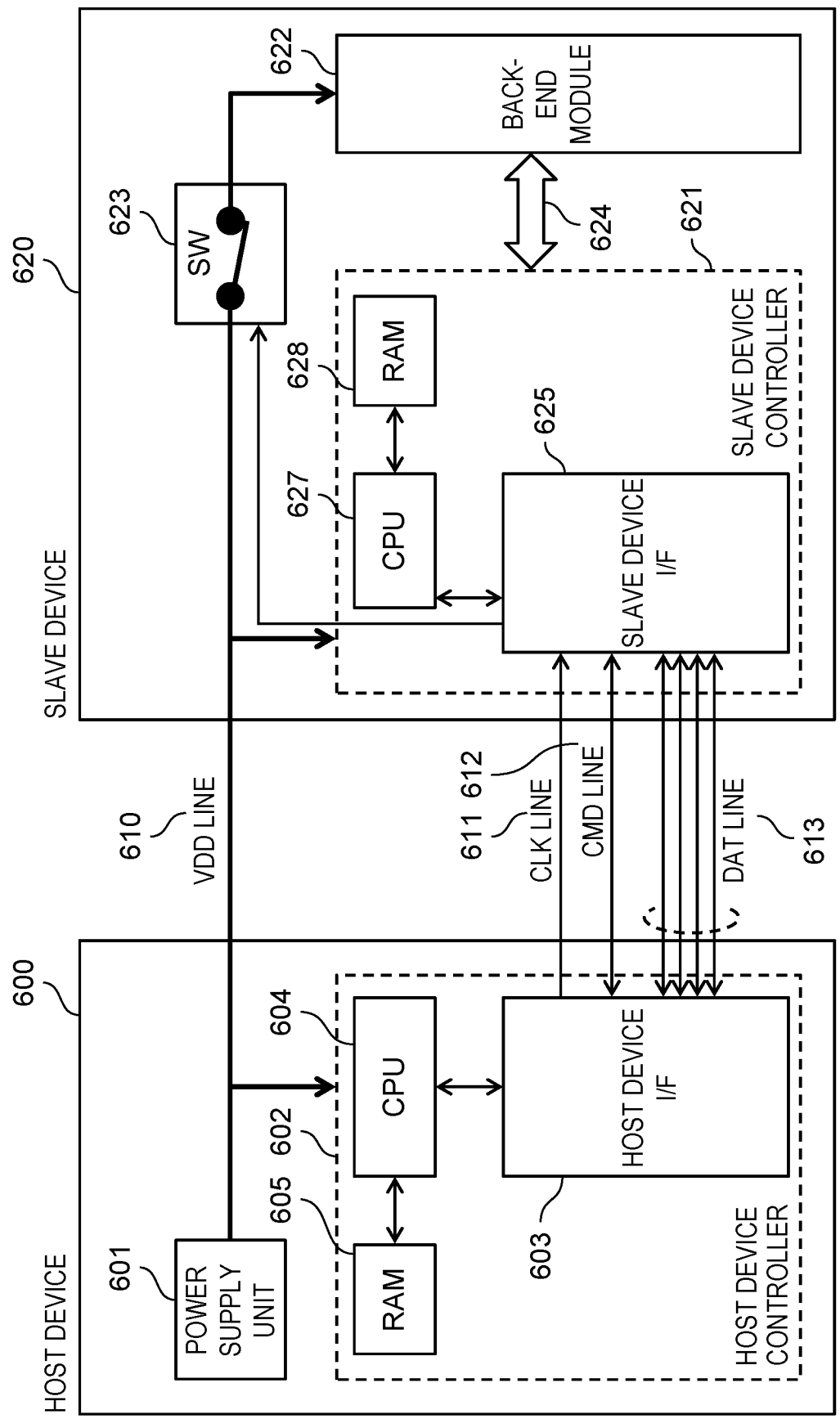
FIG. 6 is a block diagram illustrating a configuration of a host-slave system including a slave device and a host device according to first and second exemplary embodiments of the present disclosure.

FIG. 6 is a block diagram for describing a host-slave system including a slave device and a host device that controls the slave device according to a first exemplary embodiment of the present disclosure. As illustrated in FIG. 6, host device 600 includes at least power supply unit 601 and host device controller 602. Host device controller 602 includes at least host device I/F 603, CPU 604, and RAM 605 that is a volatile storage element.

Host device 600 and slave device 620 are mechanically connected. In addition, host device 600 is electrically connected to slave device 620 via VDD line 610 that is a 3.3 V power supply line.

Slave device 620 includes at least slave device controller 621, back-end module 622, SW 623 that switches ON and OFF of power supply to back-end module 622, and back-end bus 624 that performs data communication between slave device controller 621 and back-end module 622.

Slave device controller 621 includes at least slave device I/F 625, CPU 627, and RAM 628 that is a volatile storage element. Slave device controller 621 in the present disclosure controls each element in slave device 620.

Back-end module 622 in the present disclosure means a generic term of various modules arranged in the slave device in accordance with the function or purpose of the slave device, such as a storage element that stores data communicated with host device 600 and a communication module for inputting and outputting data communicated with a device including an external device other than host device 600.

Similar to the exemplary embodiment of the related art, a 3.3 V power supplied to slave device 620 via VDD line 610 is supplied to slave device controller 621, and is also supplied to back-end module 622 only in a case where SW 623 is ON.

Host device I/F 603 and slave device I/F 625 are connected via CLK line 611, CMD line 612, and DAT line 613, and perform bidirectional signal communication by a single-ended method. As in the exemplary embodiment of the related art, DAT line 613 includes four signal lines, but the number of signal lines is not limited to four.

Figure 7:
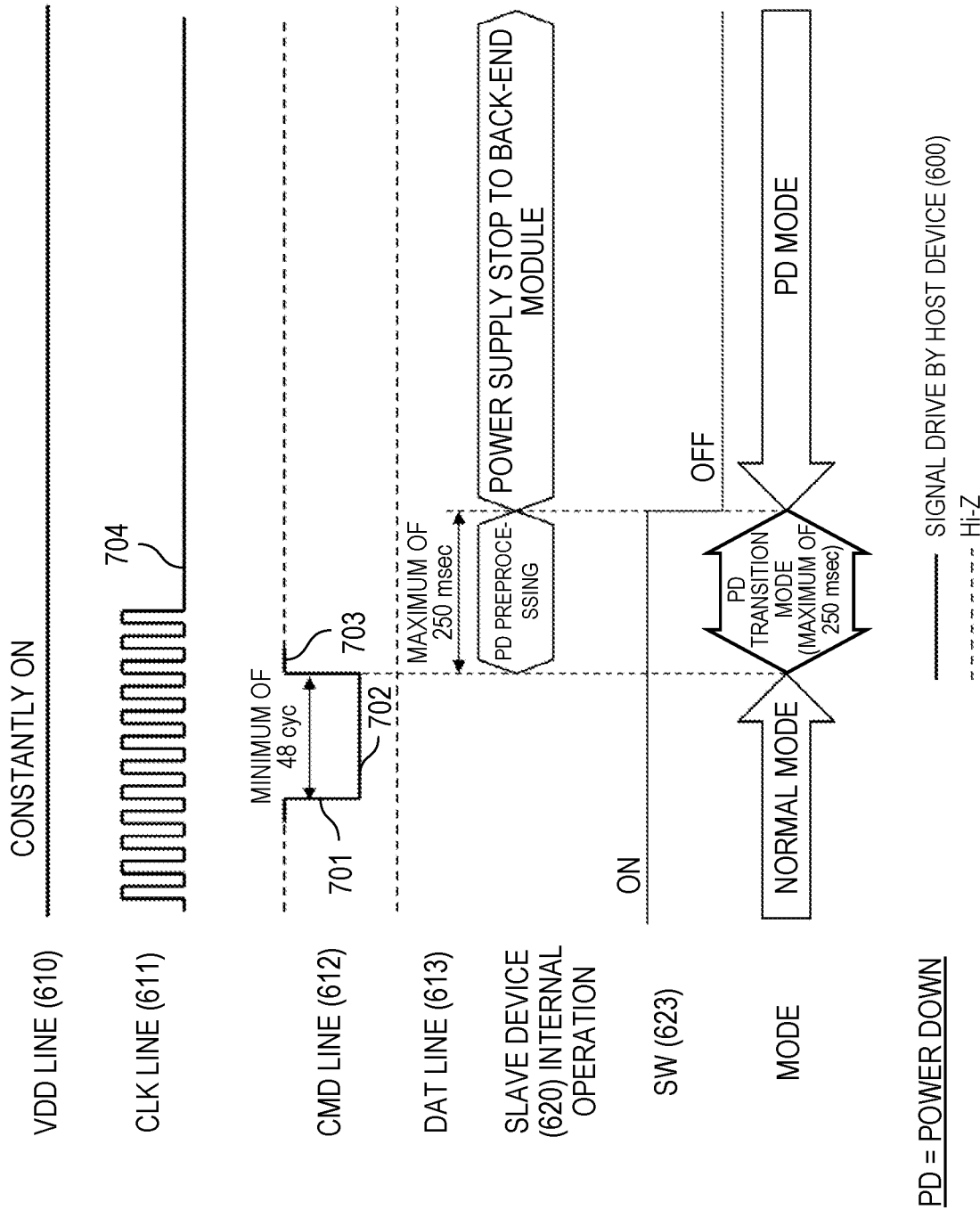
FIG. 7 is a timing chart when the host-slave system transitions from a normal mode to a power-down mode in the first exemplary embodiment of the present disclosure.
Figure 8:
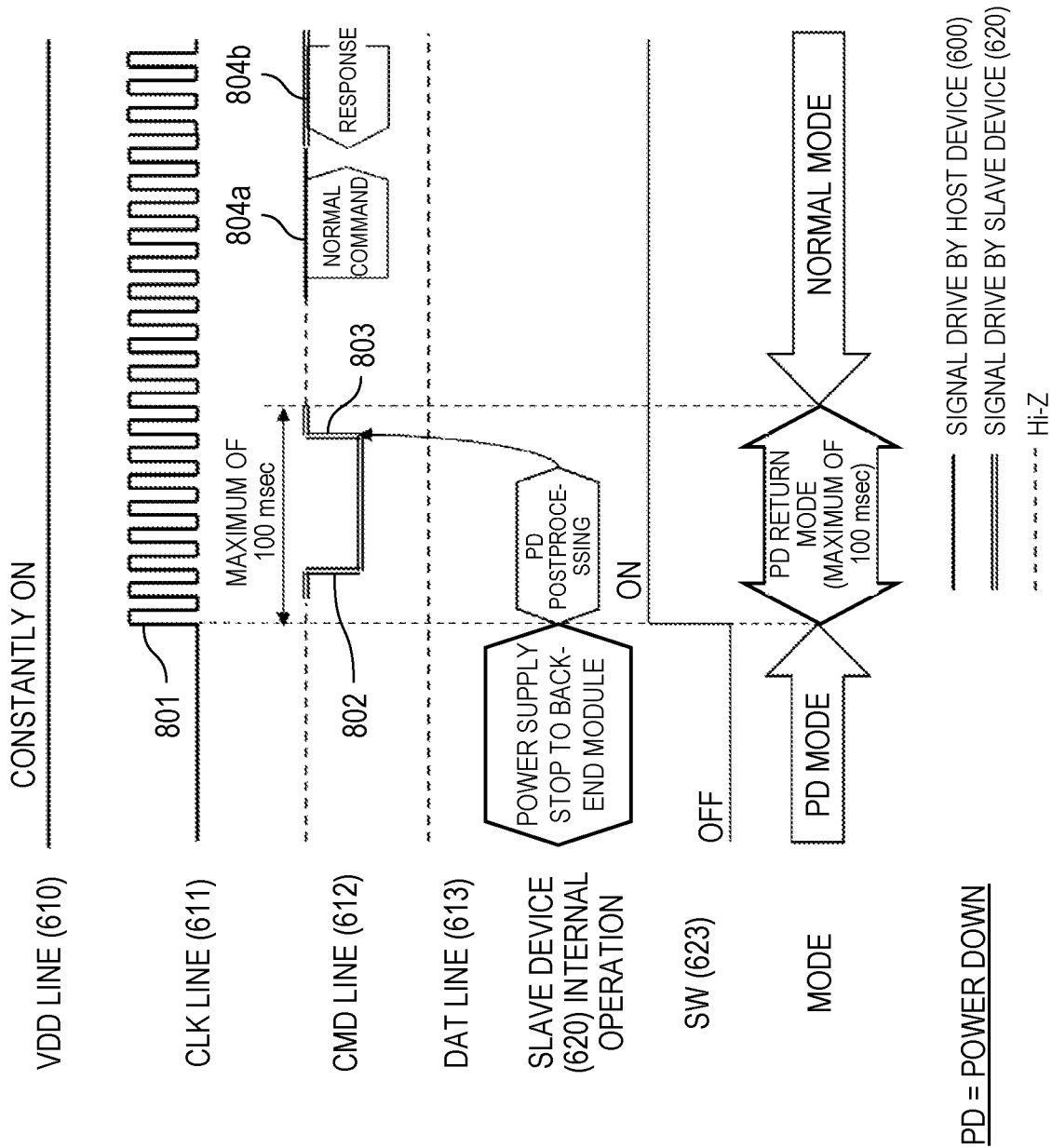
FIG. 8 is a timing chart when the host-slave system transitions from the power-down mode to the normal mode in the first exemplary embodiment of the present disclosure.

FIG. 7 is a timing chart when the host-slave system including the slave device and the connected host device transitions from the normal mode to the power-down mode according to the first exemplary embodiment of the present disclosure, and FIG. 8 is a timing chart when the host-slave system returns from the power-down mode to the normal mode.

First, the transition from the normal mode to the power-down mode in the present exemplary embodiment will be described with reference to FIGS. 6 and 7.

Similar to the exemplary embodiment of the related art, in the normal mode, host device 600 supplies the 3.3 V power to slave device 620 via VDD line 610, and supplies a single-ended clock signal of a predetermined frequency via CLK line 611. In addition, when the signal communication is not performed between host device 600 and slave device 620, CMD line 612 and DAT line 613 are in a high-impedance (Hi-Z) state and are at a high level by a pull-up resistor (not illustrated).

When host device 600 desires to transition slave device 620 to the power-down mode, host device I/F 603 in host device controller 602 drives CMD line to the high level for a short period, and then drives CMD line 612 to the low level (701). Thereafter, host device I/F 603 drives the CMD line to the low level for a minimum period of 48 cyc (702), drives CMD line 612 to the high level for a short period, and then stops the driving (703). Subsequently, host I/F device 603 stops supplying the clock signal via CLK line 611 (704).

When host device I/F 603 drives CMD line 612 to the high level, the host-slave system transitions from the normal mode to the power-down transition mode.

In the exchange of the commands and responses on CMD line 612, CMD line 612 does not become the low level continuously for a period of 48 cyc or longer. Accordingly, when it is detected that CMD line 612 is at the low level continuously for a period of 48 cyc or longer, slave device I/F 625 determines that the instruction is an instruction to transition to the power-down mode, and starts the power-down preprocessing. Similar to the exemplary embodiment of the related art, even though the supply of the 3.3 V power is stopped during the power-down mode period, consistency between the file management data and the actual file data is maintained by CPU 627 writing the file management table retained in RAM 628 to back-end module 622 via back-end bus 624 in the power-down preprocessing.

A maximum time of the power-down preprocessing in the present exemplary embodiment is 250 msec, but may be other values. Note that, this value is desirably as small as possible.

When the power-down preprocessing is completed in slave device 620, slave device I/F 625 switches SW 623 from ON to OFF and stops the power supply to back-end module 622. Note that, a switching operation of SW 623 may be performed by another component element in slave device controller 621 other than slave device I/F 625.

When the power supply to back-end module 622 is stopped, the host-slave system transitions from the power-down transition mode to the power-down mode.

During the power-down mode period, host device 600 continues the supply of the 3.3 V power via VDD line 610, but stops the supply of the clock signal via CLK line 611. In addition, during the same period, neither host device 600 nor slave device 620 drives CMD line 612 nor DAT line 613. Accordingly, both CMD line 612 and DAT line 613 including four signal lines enter the Hi-Z state.

Next, a case where the host-slave system returns from the power-down mode to the normal mode will be described with reference to FIGS. 6 and 8.

When host device 600 desires to return the host-slave system from the power-down mode to the normal mode, host device I/F 603 in host device controller 602 resumes the transmission of the clock signal to slave device 620 via CLK line 611 (801). As a result, the host-slave system transitions from the power-down mode to the power-down return mode.

When the clock signal is detected in CLK line 611, slave device I/F 625 switches SW 623 from OFF to ON. As a result, the 3.3 V power is supplied to back-end module 622 again. At the same time, slave device I/F 625 starts power-down postprocessing that is processing necessary for returning from the power-down mode to the normal mode. As in the exemplary embodiment of the related art, the power-down postprocessing includes initial setting processing on back-end module 622 by slave device controller 621.

Thereafter, slave device I/F 625 drives CMD line 612 to the high level for a short period, and then changes the CMD line to driving at the low level (802).

After slave device 620 completes the power-down post-processing, slave device I/F 625 drives CMD line 612 to the high level for a short period, and then stops the driving (803) to enter the Hi-Z state. The maximum time of the power-down postprocessing in the present exemplary embodiment is 100 msec, but may be other values. Note that, this value is desirably as small as possible.

CMD line 612 changes from the low level to the high level, and thus, host device I/F 603 detects the transition from the power-down return mode to the normal mode. As a result, host device I/F 603 in host device 600 can issue normal command 804*a* accompanied by reading and writing of data from and to back-end module 622 to slave device 620. Note that, normal command 804*a* is transmitted from host device I/F 603 in response to an instruction from CPU 604 driven based on a software program loaded onto RAM 605 in host device controller 602.

When normal command 804a is received, slave device I/F 625 transmits corresponding response 804b to host device I/F 603.

In the exemplary embodiment of the related art, a processing time for host device 100 to issue an instruction to transition from the normal mode to the power-down transition mode is a minimum of 1142 cyc, that is, about 46 psec when a clock frequency is 25 MHz that is the lowest clock frequency in this host-slave system. On the other hand, the processing time for host device 600 in the present exemplary embodiment to transition from the normal mode to the power-down transition mode (for continuously driving CMD line 612 to the low level) is a minimum of 48 cyc. This processing time corresponds to about 2 psec when the clock frequency is 25 MHz, and a reduction of about 44 psec is realized as compared with the case of the exemplary embodiment of the related art.

In addition, host device 100 in the exemplary embodiment pf the related art needs to estimate the periods of the power-down transition mode and the power-down return mode to the maximum of 1 sec. This means that even though host device 100 desires to issue normal command 504a accompanied by data access 2 sec after the transition to the power-down mode is instructed, it may take 2 sec in the power-down transition mode and the power-down return mode. Accordingly, since an effect of transitioning to the power-down mode is not practically obtained, host device 100 has to give up the transition to the power-down mode.

On the other hand, in the present exemplary embodiment, since the power-down transition mode is a maximum of 250 msec and the power-down return mode is a maximum of 100 msec, even in a case where host device 600 desires to issue normal command 804a 2 sec after the transition to the power-down mode is instructed, there is an effect that the power supply to back-end module 622 can be stopped for about 1650 msec, and power consumption of slave device 620 can be reduced.

Further, in the present exemplary embodiment, since the period of the power-down return mode is a maximum of 100 msec, host device 600 may mount a buffer having a size corresponding to a maximum of 100 msec as a time until returning to the normal mode and accessing the back-end module. The size of the buffer for temporarily retaining data in host device 600 can be greatly reduced, and cost reduction is achieved.

As described above, in the first exemplary embodiment of the present disclosure, as compared with the exemplary embodiment of the related art, a maximum time of the power-down transition mode in the middle of transitioning from the normal mode to the power-down mode and a maximum time of the power-down return mode in the middle of returning from the power-down mode to the normal mode are greatly shortened, and thus, a power saving effect due to the introduction of the parallel-down mode can be further increased.

Figure 9:
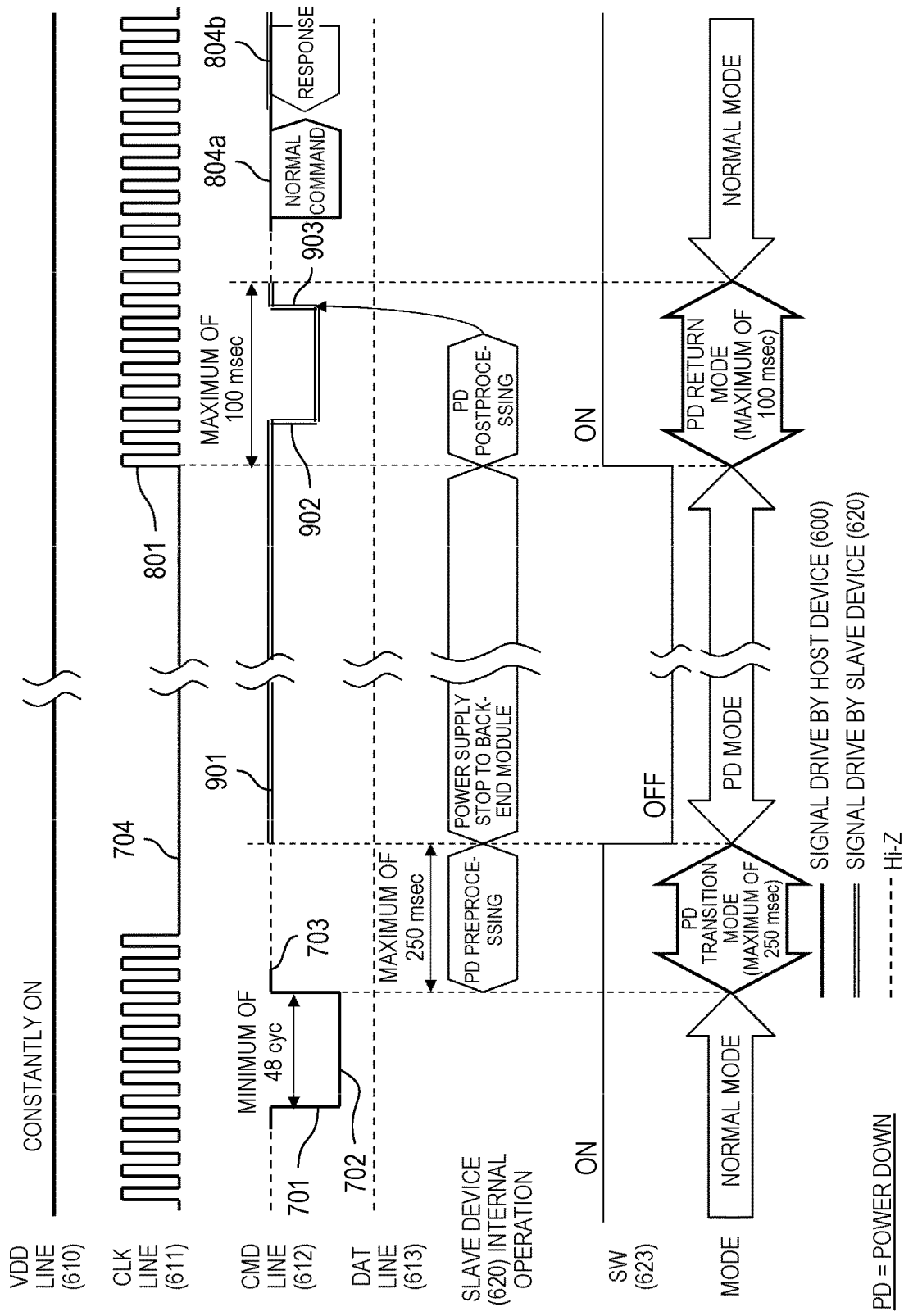
FIG. 9 is a timing chart for describing a case where the slave device drives a CMD line to a high level during a power-down mode period in the first exemplary embodiment of the present disclosure.

Note that, in the description of the present exemplary embodiment, CMD line 612 is in the Hi-Z state during the power-down mode period. In addition to the above example, as shown in FIG. 9, after the completion of the power-down preprocessing in slave device 620, slave device I/F 625 can drive CMD line 612 to the high level during the power-down mode period (901). In this case, immediately after slave device I/F 625 detects the clock signal via CLK line 611 (801), CMD line 612 is changed to the driving at the low level (902), and CMD line 612 is again driven to the high-level within 100 msec (903). Thus, the mode returns to the normal mode. Thereafter, host device I/F 603 can transmit normal command 804a.

Note that, in the description of the present exemplary embodiment, when host device 600 desires to transition from the normal mode to the power-down mode, a predetermined signal pattern is transmitted to slave device 620 by changing a voltage level of CMD line 612 as the second signal line. Similarly, when slave device 620 returns from the power-down mode to the normal mode, host device 600 is notified that the return to the normal mode is completed by changing the voltage level of CMD line 612. By contrast, the same effect is obtained as the second signal line by using even one or more DAT lines 613 instead of CMD line 612. Further, a signal line obtained by combining CMD line 612 and one or more DAT lines 613 can be used as the second signal line.

Second Exemplary Embodiment

Figure 10:
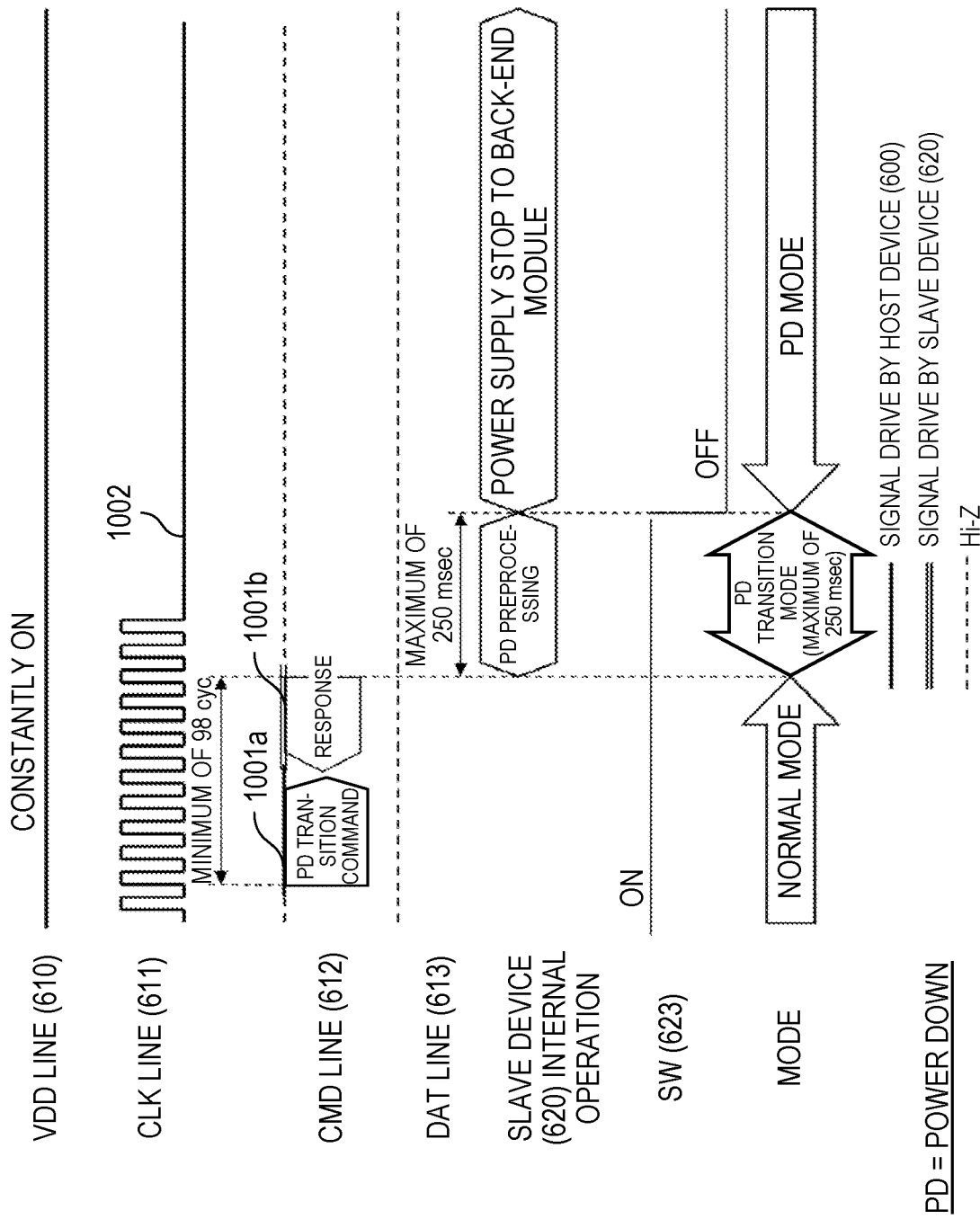
FIG. 10 is a timing chart when the host-slave system transitions from a normal mode to a power-down mode in the second exemplary embodiment of the present disclosure.

FIG. 10 is a timing chart when the host-slave system including the slave device and the connected host device transitions from the normal mode to the power-down mode according to the second exemplary embodiment of the present disclosure. Note that, a block diagram illustrating a configuration of the host-slave system according to the exemplary embodiment of the present disclosure is similar to the block diagram in FIG. 6.

Hereinafter, the transition from the normal mode to the power-down mode in the second exemplary embodiment of the present disclosure will be described mainly with reference to FIGS. 6 and 10, focusing on portions different from the portions in the first exemplary embodiment.

When host device 600 desires to transition slave device 620 to the power-down mode, host device I/F 603 transmits power down transition command 1001a to slave device 620 via CMD line 612 in response to an instruction from CPU 604 driven based on a software program loaded onto RAM 605 in host device controller 602.

When slave device I/F 625 receives power down transition command 1001a via CMD line 612, slave device I/F 625 transmits, to host device I/F 603 via CMD line 612, response 1001b indicating that power down transition command 1001a is correctly received.

Since power-down transition command 1001a is a command that is not accompanied by data transmission and reception, the data transmission and reception is completed when corresponding response 1001b is received. Accordingly, when response 1001b is received, host device I/F 603 transitions the host-slave system from the normal mode to the power down transition mode. Subsequently, host I/F device 603 stops supplying the clock signal via CLK line 611 (1002).

When power-down transition command 1001a is received, slave device I/F 625 determines that the command is an instruction to transition to the power-down mode, transmits response 1001b, and then starts the power-down preprocessing as in the first exemplary embodiment.

The subsequent transition to the power-down mode is similar to the timing chart illustrated in FIG. 7. In addition, the return from the power-down mode to the normal mode is similar to the return in the first exemplary embodiment, that is, FIG. 8.

The instruction to transition to the power-down mode in the first exemplary embodiment is realized by host device I/F 603 driving CMD line 612 to the low level for a period of 48 cyc or longer, and the processing time is minimum of 48 cyc. On the other hand, in the present exemplary embodiment, the transition instruction is realized by host device I/F 603 transmitting power-down transition command 1001a and receiving corresponding response 1001b, and the processing time is a minimum period of 98 cyc, and is longer than the case of the first exemplary embodiment.

Figure 1:
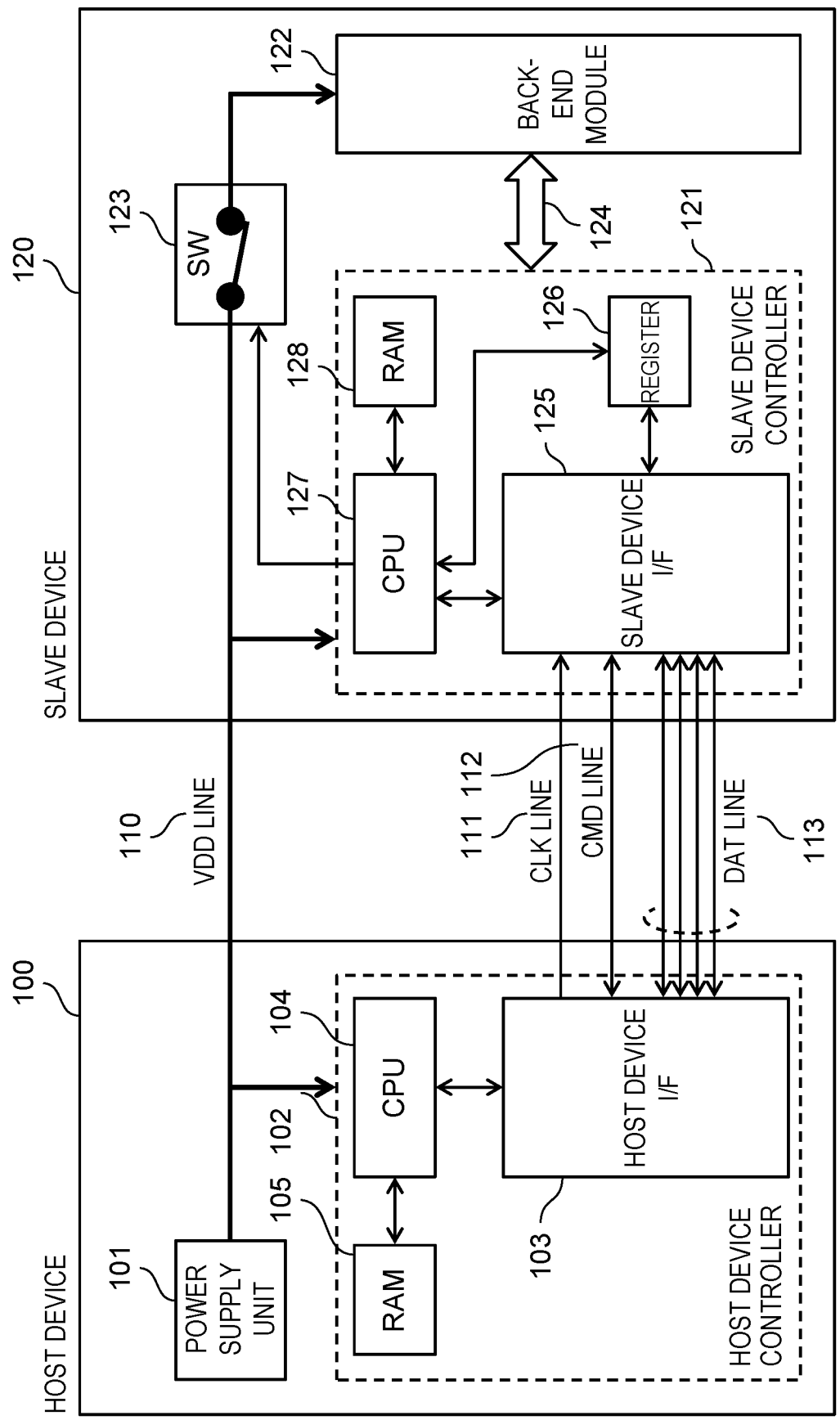
FIG. 1 is a block diagram illustrating a configuration of a host-slave system including a slave device and a host device according to an exemplary embodiment of the related art.
Figure 2:
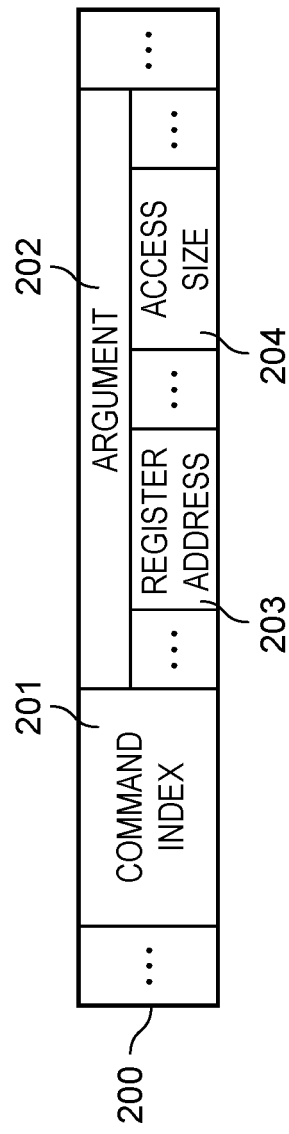
FIG. 2 is a diagram for describing a format of a command transmitted by the host device to the slave device in order to give an instruction.
Figure 3:
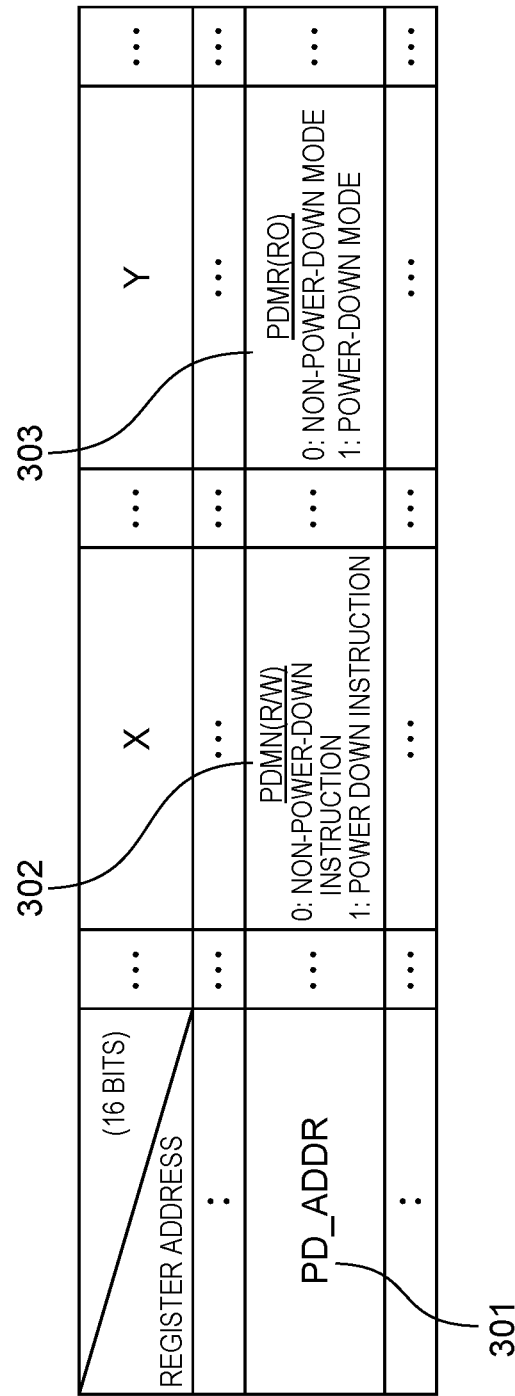
FIG. 3 is a diagram for describing a register map in a register.
Figure 4:
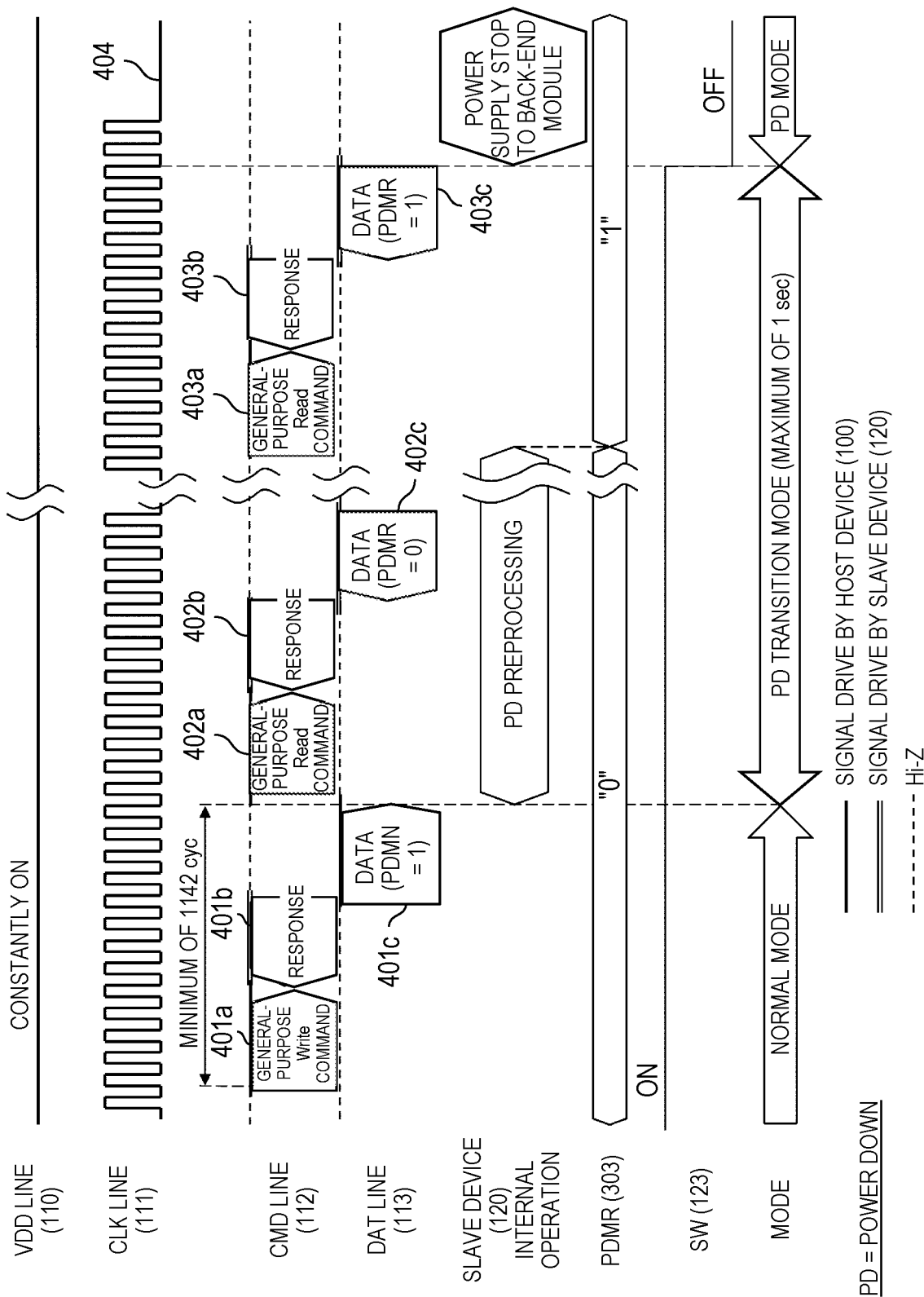
FIG. 4 is a timing chart when the host-slave system transitions from a normal mode to a power-down mode in the exemplary embodiment of the related art.

On the other hand, in the first exemplary embodiment, it is necessary to mount processing of driving to the low level for a period of 48 cyc or longer as hardware in host device I/F 603. By contrast, in the second exemplary embodiment, since it can be realized by modifying the software program of the related art such that the issuance of power-down transition command 1001a can be instructed according to the command format of FIG. 2, there is an effect that a load of development of host device 600 can be greatly reduced. In addition, a difference in processing time for instructing the transition to the power-down mode in both the exemplary embodiments is 98-48=50 cyc, that is, only 2 psec even though the clock frequency is 25 MHz that is the lowest clock frequency in the present host-slave system, and there is almost no problem.

As described above, in the second exemplary embodiment of the present disclosure, the maximum times of the power-down transition mode and the power-down return mode can also be greatly shortened as compared with the exemplary embodiment of the related art. Further, in the present exemplary embodiment, the development load of the host device can be reduced by using the power-down transition command that can be mounted only by changing the software program.

Note that, during the power-down mode period, CMD line 612 may not enter the Hi-Z state, but may be driven to the high level by slave device I/F 625.

Third Exemplary Embodiment

Figure 11:
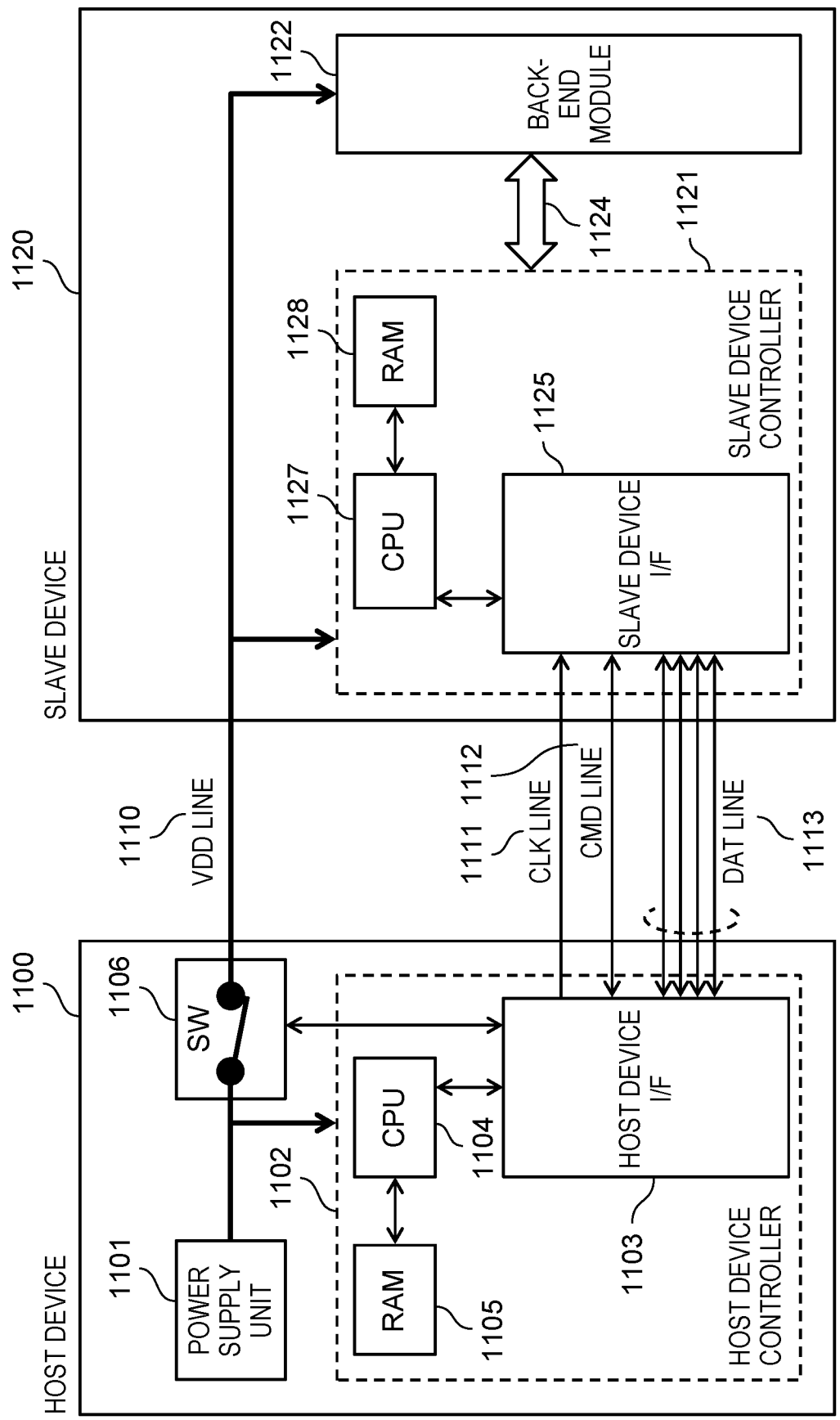
FIG. 11 is a block diagram illustrating a configuration of a host-slave system including a slave device and a host device according to a third exemplary embodiment of the present disclosure.

FIG. 11 is a block diagram illustrating a host-slave system including a slave device and a host device that controls the slave device according to a third exemplary embodiment of the present disclosure. As illustrated in FIG. 11, host device 1100 includes at least power supply unit 1101, host device controller 1102, and SW 1106 that switches ON and OFF of power supply to slave device 1120.

Host device controller 1102 includes at least host device I/F 1103, CPU 1104, and RAM 1105 that is a volatile storage element.

Host device 1100 and slave device 1120 are mechanically connected. In addition, only when SW 1106 is ON, host device 1100 is electrically connected to slave device 1120 via VDD line 1110 that is a 3.3 V power supply line.

Slave device 1120 includes at least slave device controller 1121, back-end module 1122, and back-end bus 1124 that performs data communication between slave device controller 1121 and back-end module 1122.

Slave device controller 1121 includes at least slave device I/F 1125, CPU 1127, and RAM 1128 that is a volatile storage element.

Figure 12:
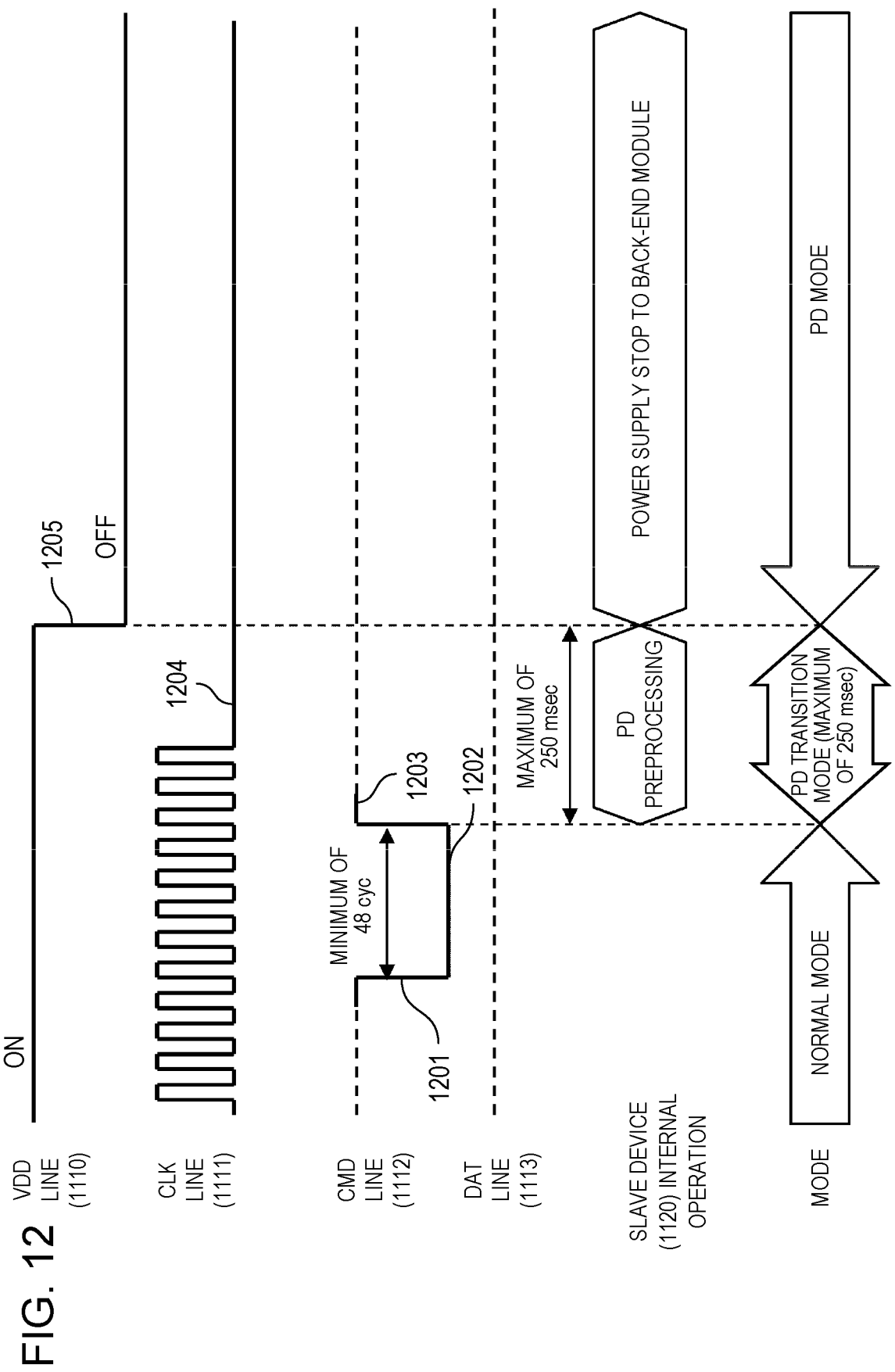
FIG. 12 is a timing chart when the host-slave system transitions from a normal mode to a power-down mode in the third exemplary embodiment of the present disclosure.
Figure 13:
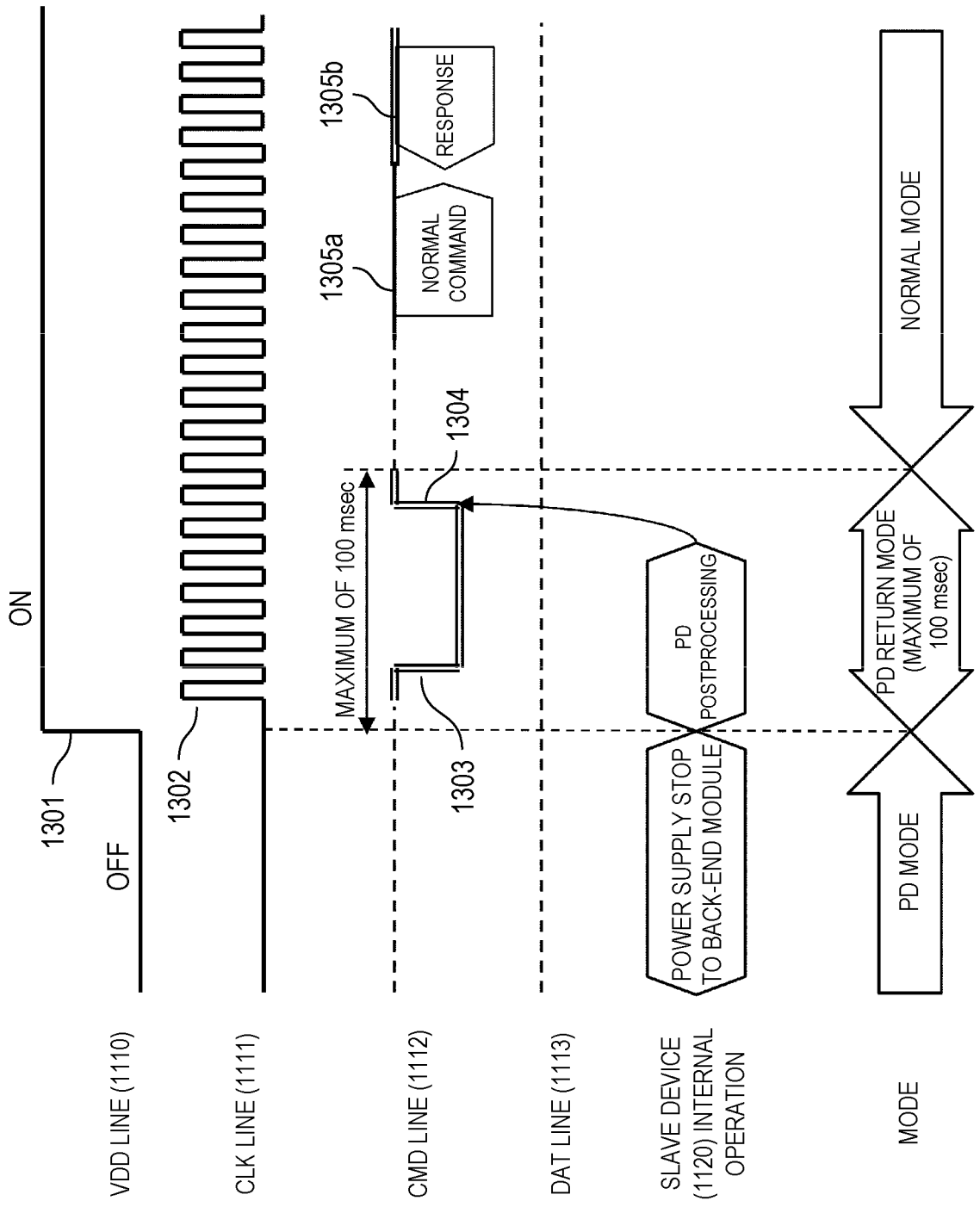
FIG. 13 is a timing chart when the host-slave system transitions from the power-down mode to the normal mode in the third exemplary embodiment of the present disclosure.

FIG. 12 is a timing chart when the host-slave system including the slave device and the connected host device transitions from the normal mode to the power-down mode according to the third exemplary embodiment of the present disclosure, and FIG. 13 is a timing chart when the host-slave system returns from the power-down mode to the normal mode.

First, the transition from the normal mode to the power-down mode in the present exemplary embodiment will be described with reference to FIGS. 11 and 12, focusing on portions different from the portions in the first exemplary embodiment.

In the normal mode, the SW in host device 1100 is ON, and host device 1100 supplies a 3.3 V power to slave device 1120 via VDD line 1110.

Similar to the first exemplary embodiment, when host device 1100 desires to transition slave device 1120 to the power-down mode, host device I/F 1103 in host device controller 1102 drives CMD line to the high level for a short period, and then drives CMD line 1112 to the low level (1201). Thereafter, host device I/F 1103 drives CMD line 1112 to the low level for a minimum period of 48 cyc (1202), drives the CMD line to the high level for a short period, and then stops the driving (1203). Subsequently, host I/F device 1103 stops supplying the clock signal via CLK line 1111 (1204).

When host device I/F 1103 drives CMD line 1112 to the high level, the host-slave system transitions from the normal mode to the power-down transition mode.

When it is detected that CMD line 1112 is at the low level continuously for a period of 48 cyc or longer, slave device I/F 1125 determines that the instruction is a transition instruction to the power-down mode, and starts the power-down preprocessing. In the present exemplary embodiment, since the 3.3 V power supply to entire slave device 1120 is stopped in the power-down mode, it is necessary to back up various variables to back-end module 1122 via back-end bus 1124 in addition to the file management table held on RAM 1128 in the power-down preprocessing.

After at least 250 msec elapses after the transition to the power-down transition mode, host device I/F 1103 switches SW 1106 from ON to OFF and stops the power supply to slave device 1120 (1205). Note that, a switching operation of SW 1106 may be performed by another component element in host device controller 1102 other than host device I/F 1103.

Since the power-down preprocessing is completed in a maximum of 250 msec, when 250 msec or more elapses after the transition to the power-down transition mode, the power-down preprocessing is completed, and there is no problem even though the power supply to slave device 1120 is stopped.

Next, a case where the host-slave system returns from the power-down mode to the normal mode will be described with reference to FIGS. 11 and 13.

When host device 1100 desires to return the host-slave system from the power-down mode to the normal mode, host device I/F 1103 switches SW 1106 from OFF to ON and starts the 3.3 V power supply to slave device 1120 (1301). In addition, host device I/F 1103 resumes the transmission of the clock signal to slave device 1120 via CLK line 1111 (1302). As a result, the host-slave system transitions from the power-down mode to the power-down return mode.

When the 3.3 V power is supplied again to slave device 1120 via VDD line 1110, slave device I/F 1125 starts power-down postprocessing that is processing necessary for returning from the power-down mode to the normal mode. In the present exemplary embodiment, since the 3.3 V power supply to slave device 1120 is stopped in the power-down mode, the software program retained in the RAM disappears. Accordingly, in the power-down postprocessing, after the initial setting processing for back-end module 1122, it is necessary to read out the software program from back-end module 1122 and the variable backed up in back-end module 1122 in the power-down preprocessing, and it is necessary to load the read-out variables into RAM 1128 via back-end bus 1124.

Thereafter, as in the first exemplary embodiment, slave device I/F 1125 drives CMD line 1112 to the high level for a short period, and then changes the CMD line to driving at the low level (1303).

After slave device 1120 completes the power-down post-processing, slave device I/F 1125 drives CMD line 1112 to the high level for a short period, and then stops the driving (1304) to enter the Hi-Z state.

CMD line 1112 is changed from the low level to the high level, and thus, host device I/F 1103 can detect the transition from the power-down return mode to the normal mode. The host device I/F can issue normal command 1305a to slave device I/F 1125.

After normal command 1305a is received, slave device I/F 1125 transmits corresponding response 1305b to host device I/F 1103.

As described above, similar to the first exemplary embodiment, in the third exemplary embodiment of the present disclosure, the maximum time of the power-down transition mode and the maximum time of the power-down return mode are greatly shortened, and thus, the power saving effect due to the introduction of the parallel-down mode can be further increased.

In the present exemplary embodiment, since the 3.3 V power is not supplied to slave device 1120 during the power-down mode, it is necessary to perform an operation of retaining the variable retained in RAM 1128 in back-end module 1122 in the power-down transition mode or an operation of loading the variable and the software program loaded onto the RAM from back-end module 1122 to RAM 1128 again in the power-down recovery mode. The processing time of each mode becomes longer than the processing time in the case of the first exemplary embodiment.

However, in the present exemplary embodiment, during the power-down mode period, since the power supply to slave device controller 1121 in addition to back-end module 1122 is stopped, the power consumption can be further reduced.

Note that, in the third exemplary embodiment, host device 1100 can instruct the transition to the power-down mode by transmitting the power-down transition command as in the second exemplary embodiment. In addition, during the power-down mode, CMD line 1112 may be driven to the high level by slave device I/F 1125 instead of the Hi-Z state.

Note that, in the third exemplary embodiment, similar to the first exemplary embodiment, it is also possible to use, as the second signal line, one or more DAT lines 613 instead of CMD line 612, or a signal line obtained by combining CMD line 612 and one or more DAT lines 613.

Note that, in all the exemplary embodiments of the present disclosure, the slave device changes the CMD line from the low level to the high level to notify the end of the power-down return mode, but another signal pattern, for example, a response may be transmitted from the slave device to the host device to notify the end of the power-down return mode.

In addition, in all the exemplary embodiments of the present disclosure, during the power-down mode period, the CMD line and the DAT line are all set to the high level (driving by slave device or Hi-Z), but may be set to the low level.

INDUSTRIAL APPLICABILITY

The present disclosure can be applied to a slave device such as an SD card and a host device that controls the slave device.

REFERENCE MARKS IN THE DRAWINGS 100 host device
101 power supply unit
102 host device controller
103 host device I/F
104 CPU
105 RAM
110 VDD line
111 CLK line
112 CMD line
113 DAT line
120 slave device
121 slave device controller
122 back-end module
123 SW
124 back-end bus
125 slave device I/F
126 register
127 CPU
128 RAM
200 command
201 command index
202 argument
203 register address
204 access size
301 PD_ADDR
302 PDMN
303 PDMR
401a general-purpose Write command
401b response
401c data
402a general-purpose Read command
402b response
402c data
403a general-purpose Read command
403b response
403c data
501a general-purpose Write command
501b response
501c data
502a general-purpose Read command
502b response
502c data
503a general-purpose Read command
503b response
503c data
504a normal command
504b response
600 host device
601 power supply unit
602 host device controller
603 host device I/F
604 CPU
605 RAM
610 VDD line
611 CLK line
612 CMD line
613 DAT line
620 slave device
621 slave device controller 622 back-end module
623 SW
624 back-end bus
625 slave device I/F
627 CPU
628 RAM
804*a* normal command
804*b* response
1001*a* power-down transition command
1001*b* response
1100 host device
1101 power supply unit
1102 host device controller
1103 host device I/F
1104 CPU
1105 RAM
1106 SW
1110 VDD line
1111 CLK line
1112 CMD line
1113 DAT line
1120 slave device
1121 slave device controller
1122 back-end module
1124 back-end bus
1125 slave device I/F
1127 CPU
1128 RAM
1305*a* normal command
1305*b* normal command

The invention claimed is:

1. A slave device that is connected to a host device via a plurality of signal lines including a first signal line and a second signal line, comprising:
    a controller; and
    a back-end module, wherein:
    in a case where the slave device is in a first mode in which a clock signal supplied from the host device is received via the first signal line and a power supplied from the host device is supplied to both the controller and the back-end module, when the controller receives a first predetermined signal pattern via the second signal line and does not receive the clock signal via the first signal line, the slave device transitions to a second mode in which the power supplied to the back-end module is stopped, and
    in a case where the slave device is in the second mode, when the controller receives the clock signal via the first signal line, the slave device transitions to the first mode and transmits a second predetermined signal pattern via the second signal line.

2. The slave device according to claim 1, wherein the first predetermined signal pattern includes a signal of a first voltage level, a signal of a second voltage level, and a signal of the first voltage level in this order.

3. The slave device according to claim 1, wherein the first predetermined signal pattern indicates a predetermined command.

4. The slave device according to claim 1, wherein the second predetermined signal pattern includes a signal of a second voltage level and a signal of a first voltage level in this order.

5. The slave device according to claim 1, wherein the second predetermined signal pattern indicates a predetermined response.

6. The slave device according to claim 2, wherein the first voltage level is higher than 0 V, and the second voltage level is 0 V.

7. The slave device according to claim 1, wherein the back-end module has a function of recording data transmitted from the host device.

8. The slave device according to claim 1, wherein the back-end module has a function of transmitting and receiving data to and from a device other than the host device via a wireless interface.

9. The slave device according to claim 4, wherein the first voltage level is higher than 0 V, and the second voltage level is 0 V.

10. A host device that is connected to a slave device via a plurality of signal lines including a first signal line and a second signal line, comprising:
    a controller; and
    a power supply unit that supplies a power to the slave device, wherein:
    in a first mode in which the power is supplied to the slave device via a power supply line by the power supply unit and a clock signal is supplied via the first signal line from the controller, after the controller transmits a first predetermined signal pattern via the second signal line, the host device transitions to a second mode in which the clock signal is not supplied from the controller via the first signal line, and
    in the second mode, after the controller supplies the clock signal via the first signal line and receives a second predetermined signal pattern via the second signal line, the host device transmits a signal to the slave device.

11. The host device according to claim 10, wherein, in the second mode, the power supply unit does not supply the power to the slave device via the power supply line.

12. The host device according to claim 10, wherein the first predetermined signal pattern includes a signal of a first voltage level, a signal of a second voltage level, and a signal of the first voltage level in this order.

13. The host device according to claim 10, wherein the first predetermined signal pattern indicates a predetermined command.

14. The host device according to claim 10, wherein the second predetermined signal pattern includes a signal of a second voltage level and a signal of a first voltage level in this order.

15. The host device according to claim 10, wherein the second predetermined signal pattern indicates a predetermined response.

16. The host device according to claim 12, wherein the first voltage level is higher than 0 V, and the second voltage level is 0 V.

17. The host device according to claim 14, wherein the first voltage level is higher than 0 V, and the second voltage level is 0 V.

* * * * *